(12) United States Patent
Mroczkowski et al.

(10) Patent No.: US 11,662,363 B2
(45) Date of Patent: May 30, 2023

(54) TEST SOCKET ASSEMBLY WITH ANTENNA AND RELATED METHODS

(71) Applicant: XCERRA CORPORATION, Norwood, MA (US)

(72) Inventors: Jason Mroczkowski, St. Paul, MN (US); Dongmei Han, St. Paul, MN (US); Victor Landa, St. Paul, MN (US)

(73) Assignee: XCERRA CORPORATION, Norwood, MA (US)

( * ) Notice: Subject to any disclaimer, the term of this patent is extended or adjusted under 35 U.S.C. 154(b) by 73 days.

(21) Appl. No.: 16/911,222

(22) PCT Filed: Oct. 19, 2018

(86) PCT No.: PCT/US2018/056694
§ 371 (c)(1),
(2) Date: Jun. 24, 2020

(87) PCT Pub. No.: WO2019/133097
PCT Pub. Date: Jul. 4, 2019

(65) Prior Publication Data
US 2021/0364547 A1    Nov. 25, 2021

Related U.S. Application Data

(60) Provisional application No. 62/611,873, filed on Dec. 29, 2017.

(51) Int. Cl.
*G01R 1/04* (2006.01)

(52) U.S. Cl.
CPC ........... *G01R 1/045* (2013.01); *G01R 1/0466* (2013.01)

(58) Field of Classification Search
CPC ............................. G01R 1/045; G01R 1/0466
See application file for complete search history.

(56) References Cited

U.S. PATENT DOCUMENTS

| | | | |
|---|---|---|---|
| 5,594,355 A | 1/1997 | Ludwig | |
| 6,335,703 B1 | 1/2002 | Chang et al. | |
| 2014/0370821 A1 | 12/2014 | Guterman et al. | |
| 2015/0369840 A1 | 12/2015 | Treibergs et al. | |
| 2017/0102409 A1 | 4/2017 | Sarhad et al. | |
| 2017/0229754 A1* | 8/2017 | Lee ................... | G01R 31/2886 |

(Continued)

OTHER PUBLICATIONS

Patent Cooperation Treaty, International Searching Authority, Search Report and Written Opinion for PCT/US2018/056694, 14 pages, dated Jan. 23, 2019.

(Continued)

*Primary Examiner* — Paresh Patel
(74) *Attorney, Agent, or Firm* — Viksnins Harris Padys Malen LLP

(57) ABSTRACT

A test socket assembly includes a contactor body having one or more compliant interconnects, and a socket opening sized and configured to receive a device under test therein. The test socket assembly further includes a lead frame assembly disposed within the contactor body and electrically coupled with the one or more compliant interconnects, and one or more antennas at least partially disposed within the contactor body, the one or more antennas configured to directly and wirelessly communicate to the device under test when the device is disposed within the socket opening.

2 Claims, 12 Drawing Sheets

(56) References Cited

U.S. PATENT DOCUMENTS

2017/0279491 A1 9/2017 Lam
2018/0003736 A1* 1/2018 Lee .......................... G01R 1/24

OTHER PUBLICATIONS

Seo, K , "Planar Microstrip-To-Waveguide Transition in Millimeter-Wave Band", InTech, 249-277, http://dx.doi.org/10.5772/54662 (2013).

* cited by examiner

Patch antenna holes in socket

Patch antenna array #1

TEST SOCKET ASSEMBLY WITH ANTENNA AND RELATED METHODS

PRIORITY APPLICATION

This application claims priority to U.S. Provisional Application No. 62/611,873 that was filed on Dec. 29, 2017. The entire contents of the application referenced above is hereby incorporated by reference herein.

TECHNICAL FIELD

Test contactor assemblies and related methods.

TECHNICAL BACKGROUND

Test contactors are used on printed circuit boards to test various parameters and/or components of semiconductor devices. Electronic devices have become smaller yet more powerful, resulting crowded and complex circuit boards. For example, modern automobiles are using RADAR equipment for collision avoidance, parking assist, automated driving, cruise control, etc. The radio frequencies used in such systems are typically 76-81 GHz (W-band). Also, the radio frequencies used for wife applications are in the range of 56-64 GHz. Next generation IC's will push operating frequencies to even higher levels, for example in the cellular backhaul market space. Furthermore, semiconductor devices include antenna in package to minimize the footprint of the overall wireless chipset. Semiconductor devices that operate at these frequencies and those that include antenna in package need to be tested, but existing test contactor technology cannot communicate wirelessly with the antenna in package.

SUMMARY

The test socket assembly described herein allows for the assembly to directly communicate with a device under test via the antenna of the device under test and an antenna that is incorporated into the test socket assembly.

In one or more embodiments, a test socket assembly includes a contactor body having one or more compliant interconnects, and a socket sized and configured to receive a device under test therein. The test socket assembly further includes a lead frame assembly disposed within the contactor body, and the lead frame assembly including one or more antennas at least partially disposed within the contactor body, the one or more antennas configured to directly and wirelessly communicate to the device under test when the device is disposed within the socket.

In one or more embodiments, at least one of the one or more antennas is a patch antenna.

In one or more embodiments, the one or more antennas are configured to transmit and/or receive signals.

In one or more embodiments, the one or more antennas is a single patch antenna, and the single patch antenna is a receiver and a transmitter.

In one or more embodiments, the one or more antennas is a patch antenna array, and the patch antenna array(s) are receivers and/or transmitters.

In one or more embodiments, the contactor body includes one or more radiation openings adjacent to the one or more antennas, the one or more radiation openings configured to allow transmission of a wireless signal to or from the one or more antennas.

In one or more embodiments, the compliant interconnects are configured to transmit low speed signals.

In one or more embodiments, the test socket assembly further includes a back short disposed adjacent to the lead frame assembly and the one or more antennas.

In one or more embodiments, the test socket assembly further includes a manual actuator, and the manual actuator has a reflector therein.

In one or more embodiments, the test socket assembly further includes a handler nest, and the handler nest has a reflector therein.

In one or more embodiments, the test socket assembly further includes a first device under test disposed with the socket.

In one or more embodiments, a test socket assembly includes a contactor body having one or more compliant interconnects therein, a printed circuit board coupled with the contactor body, where the contactor body has a socket opening sized and configured to receive a device under test therein. The test socket assembly further includes a lead frame assembly disposed on top of the contactor body, at least one back short disposed on top of the lead frame assembly, and one or more antennas at least partially disposed within the lead frame assembly, the one or more antennas configured to directly and wirelessly communicate to the device under test when the device is disposed within the socket, the one or more antennas electrically coupled with the lead frame assembly, the one or more antennas disposed between the contactor body and the back short.

In one or more embodiments, the back short has at least one recess therein, recess directly adjacent to the antennas.

In one or more embodiments, the back short has at least one compliant interconnect therein.

In one or more embodiments, the test socket assembly further includes a wave guide disposed between the printed circuit board and the lead frame assembly, where the wave guide communicates high speed signals to the one or more antennas.

In one or more embodiments, the compliant interconnects are configured to transmit low speed signals.

In one or more embodiments, the test socket assembly further includes a plunger coupled with the lead frame assembly, a first wave guide disposed within the plunger and coupled with the lead frame assembly, a second wave guide disposed within the contactor body and coupled with the printed circuit board, the plunger movable from a first position to a second position, in the first position the first wave guide is uncoupled from the second wave guide, in the second position the first wave guide is electrically coupled with the second wave guide.

In one or more embodiments, a method for testing components includes disposing a device under test in a test socket assembly, the test socket assembly comprising a contactor body having one or more compliant interconnects therein, the contactor body having a socket opening sized and configured to receive a device under test therein, a lead frame assembly disposed within the contactor body, and the lead frame assembly including one or more antennas at least partially disposed within the contactor body, the one or more antennas configured to directly communicate to the device under test when the device is disposed within the socket. The method further includes contacting the device under test with the compliant interconnects, and sending wireless signals to the device under test with the one or more antennas, and the device under test receives the wireless signals.

In one or more embodiments, the device under test includes one or more device antennas, further comprising sending wireless signals from the device under test to the one or more antennas.

In one or more embodiments, the method further includes sending low speed signals between the device under test and the printed circuit board via the one or more compliant interconnects.

In one or more embodiments, sending wireless signals to the device under test with the one or more antennas includes sending wireless signals to the device under test with at least one patch antenna within the contactor body.

These and other embodiments, aspects, advantages, and features of the present invention will be set forth in part in the description which follows, and will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

BRIEF DESCRIPTION OF THE FIGURES

FIG. 6 illustrates a perspective view of a lead frame assembly as constructed in one or more embodiments.

DETAILED DESCRIPTION

Figure 1:
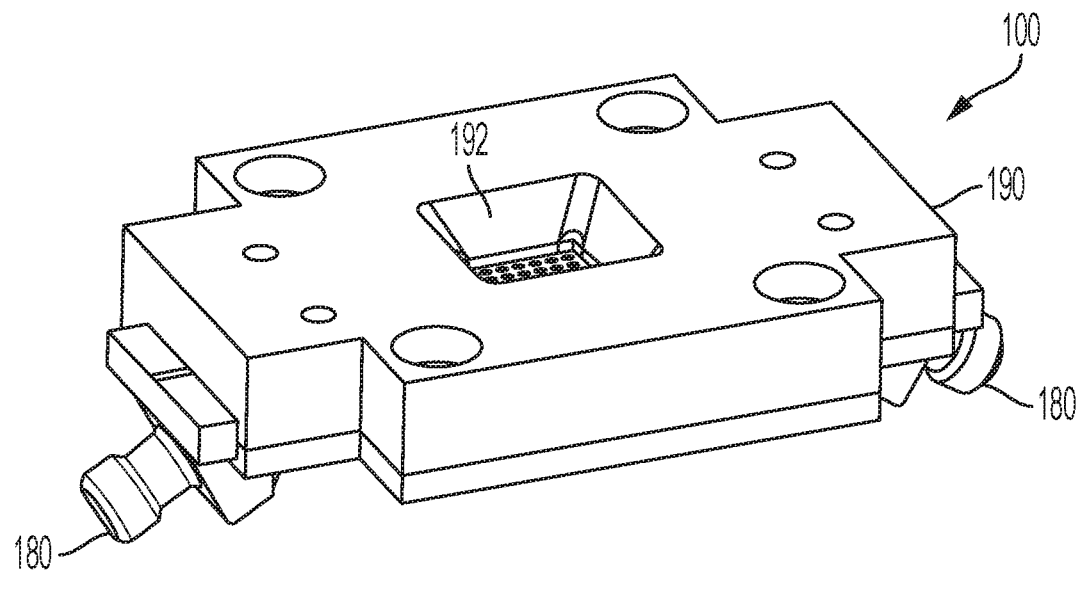
FIG. 1 illustrates a perspective view of a portion of a test socket assembly as constructed in one or more embodiments.

The following detailed description includes references to the accompanying drawings, which form a part of the detailed description. The drawings show, by way of illustration, specific embodiments in which the apparatus may be practiced. These embodiments, which are also referred to herein as "examples" or "options," are described in enough detail to enable those skilled in the art to practice the present embodiments. The embodiments may be combined, other embodiments may be utilized or structural or logical changes may be made without departing from the scope of the invention. The following detailed description is, therefore, not to be taken in a limiting sense and the scope of the invention is defined by the appended claims and their legal equivalents.

In this document, the terms "a" or "an" are used to include one or more than one, and the term "or" is used to refer to a nonexclusive "or" unless otherwise indicated. In addition, it is to be understood that the phraseology or terminology employed herein, and not otherwise defined, is for the purpose of description only and not of limitation.

FIGS. 1, 3-5 illustrate a test socket assembly 100 with one or more antennas 150 to wirelessly communicate with a device under test 200 (FIG. 2), for example via antennas. In one or more embodiments, the test socket assembly 100 communicates both wirelessly and via compliant interconnects with the device under test 200 in a hybrid arrangement. The test socket assembly 100 allows direct communication between test hardware and the device under test wirelessly while maintaining a contacted spring probe interface for remaining standard inputs and outputs on a BGA/QFN/WLCSP, or any other packaging technology. The test socket assembly 100 can include compliant interconnects and compliant or static lead frames and other features as described in US2015/0369840, which is incorporated herein by reference in its entirety.

In one or more embodiments the test socket assembly 100 includes contactor body 190, a lead frame assembly 140, compliant interconnects 120, a printed circuit board 144, one or more antennas 150, and an optional back short 170. In one or more embodiments, the test socket assembly 100 is an integrated circuit test socket that combines antennas and compliant interconnects in an insulative contactor body with a conductive structure that includes an optional flexible ground plane and impedance controlled microwave structures that carry very high speed signals in coplanar waveguide structures and coaxial connectors and/or rectangular waveguides that interface with test equipment.

Figure 2:
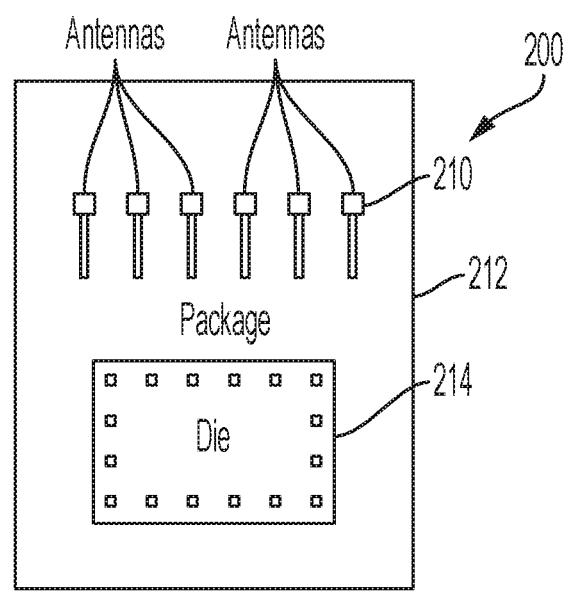
FIG. 2 illustrates a schematic diagram of a device under test as constructed in one or more embodiments.
Figure 3:
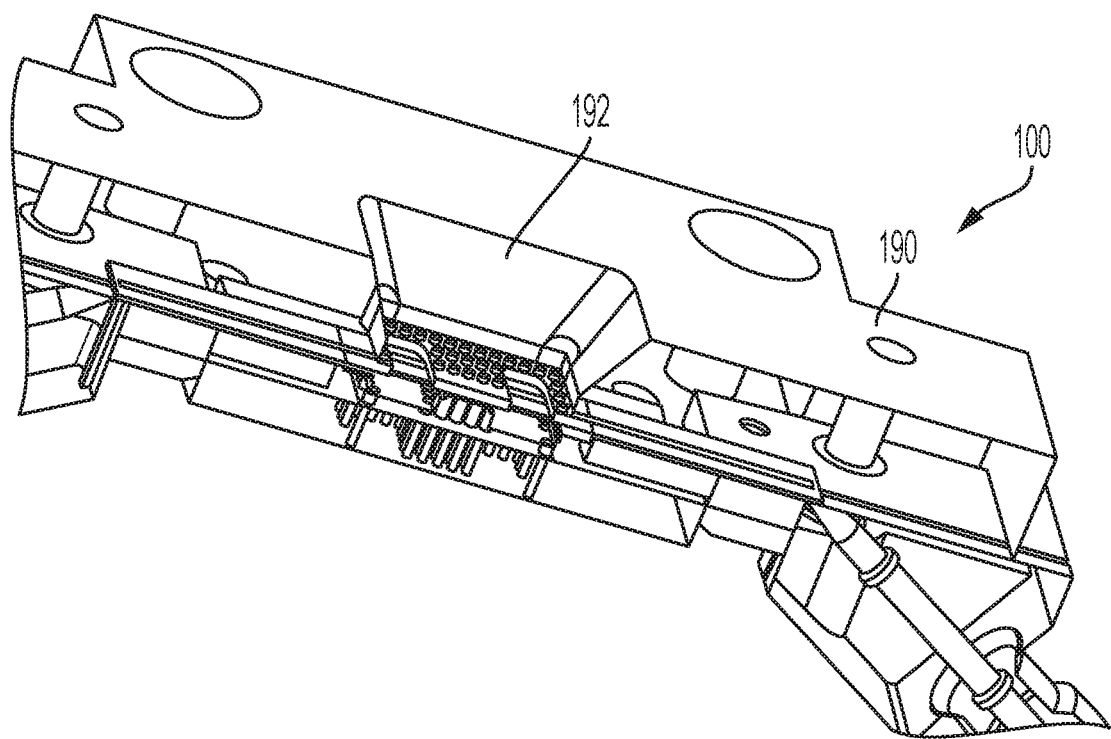
FIG. 3 illustrates a cross-sectional view of a test socket assembly as constructed in one or more embodiments.
Figure 4B:
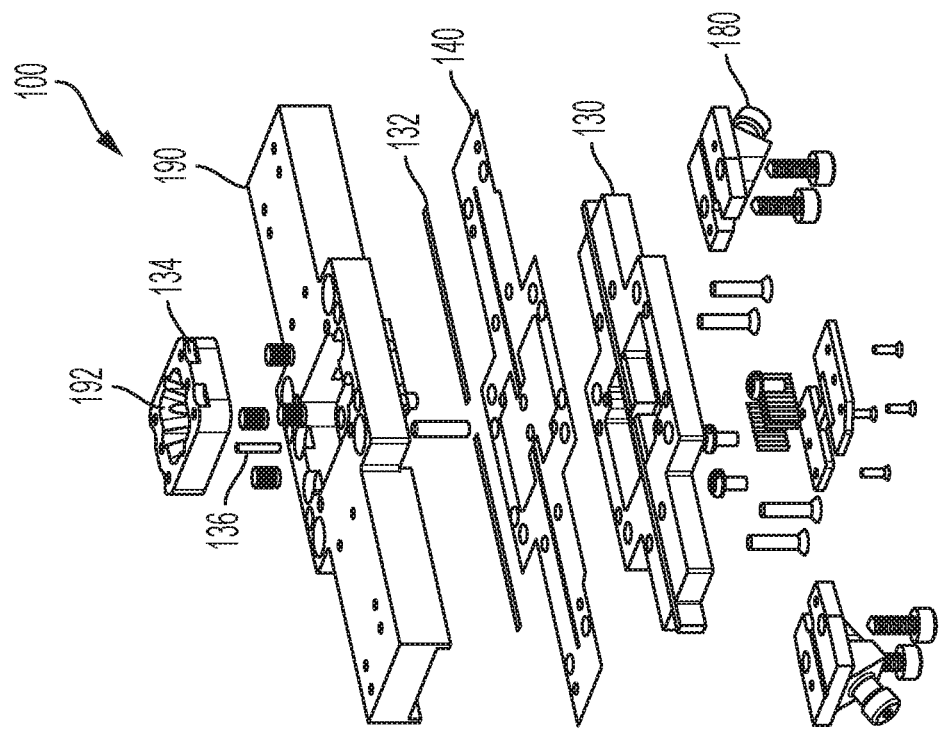
FIGS. 4A and 4B illustrate a view and an exploded perspective view of a test socket assembly as constructed in one or more embodiments.
Figure 4A:
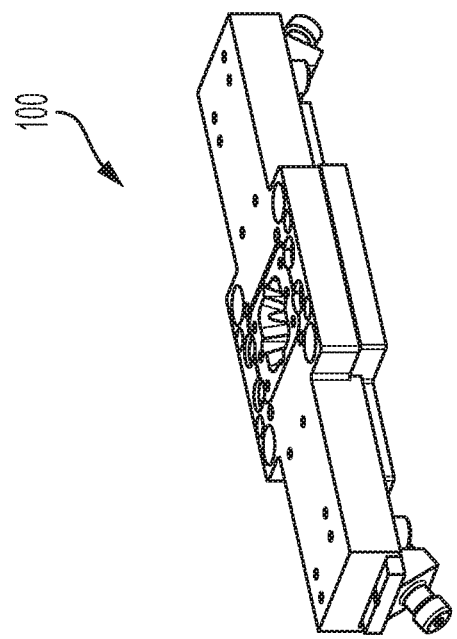
Figure 5:
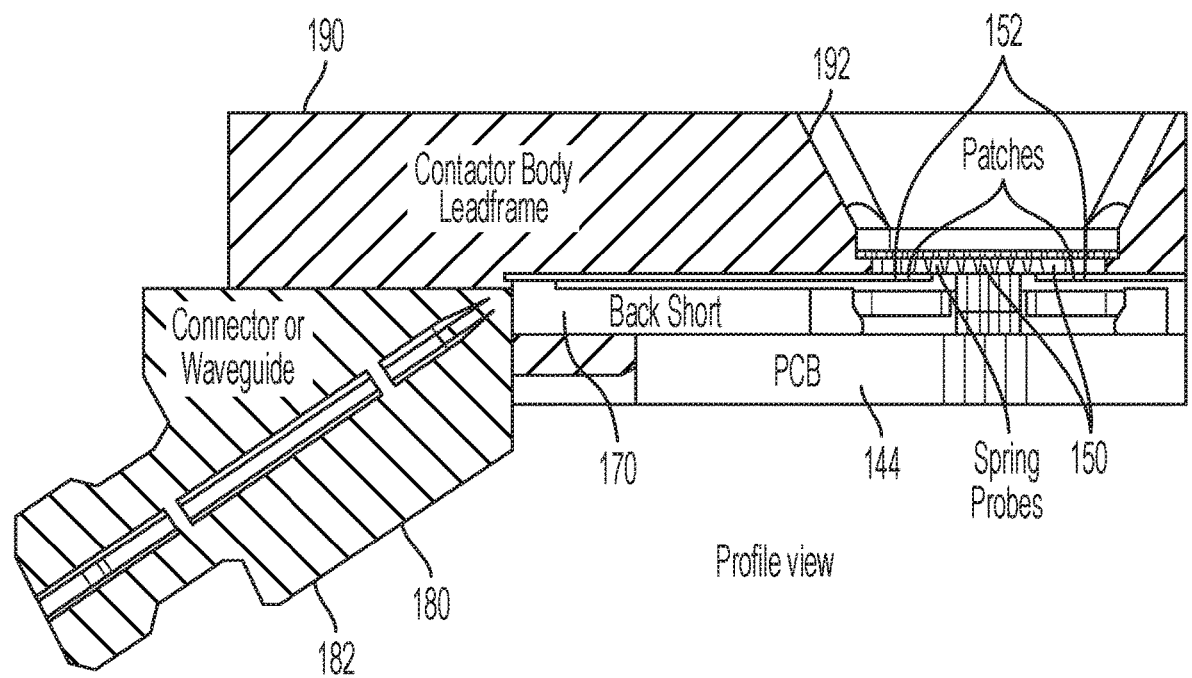
FIG. 5 illustrates a cross-sectional view of a test socket assembly as constructed in one or more embodiments.
Figure 6:
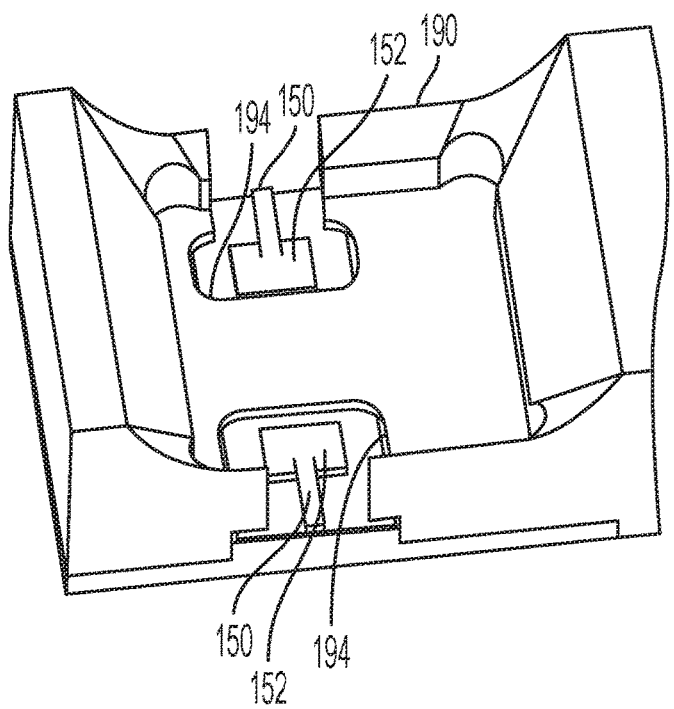
FIG. 6 illustrates a view of a portion of lead frame assembly as constructed in one or more embodiments.

The test socket assembly 100 is used with a device under test 200. Referring to FIG. 1, a socket opening 192 within the contactor body receives the device under test 200 therein and assists in aligning the device under test 200 with the test socket assembly 100. The socket opening 192 is sized and configured to receive the device under test therein. FIG. 2 shows the device under test 200 in greater detail. The device under test 200 includes a package 212 within which is a die 214, in one or more embodiments. The device under test 200 further includes one or more device under test antennas 210. The device under test 200 uses the antennas 210 to communicate high speed signals with the test contact assembly 100. The antennas 210 act as a transmitter and/or a receiver when communicating with the test socket assembly 100.

FIGS. 3-6 illustrate the test socket assembly 100 in greater detail. The test socket assembly includes a lead frame assembly 140 and one or more compliant interconnects 120, and one or more antennas 150. The lead frame assembly 140 is disposed within the contactor body 190, and is electrically coupled with the one or more compliant interconnects 120, which are also disposed within the contactor body 190. Referring to FIGS. 4A and 4B, the test socket assembly 100 further includes a floating alignment plate 134 which forms the socket 49. The test socket assembly 100 further includes a substrate 132 or plate that holds the antenna in alignment with the lead frame ground plane. The substrate is a high speed low loss dielectric material. Dowel pins 136 hold the backshort, lead frame assembly 140, and contactor body 190 and mounting block 130 in alignment. The lead frame assembly 140 is further electrically coupled and/or forms the one or more antennas 150.

The one or more antennas 150 is disposed at least partially within the contactor body 190, and is positioned to be directly under the device under test 200. The one or more antennas 150 is configured to directly and wirelessly communicate to the device under test 200 when the device under test 200 is disposed within the socket opening 192. Since the one or more antennas 150 is at least partially within the contactor body 190, the antennas can be moved up and down to change the gain and phase of the signal received at the device under test, allowing for improved testing. The antenna design and location can be adjusted to the required amplitude and phase depending on the tester source signal and the device under test sensitivity and source capability. The components can be optimized for phase and amplitude at any specified frequency.

Figure 14:
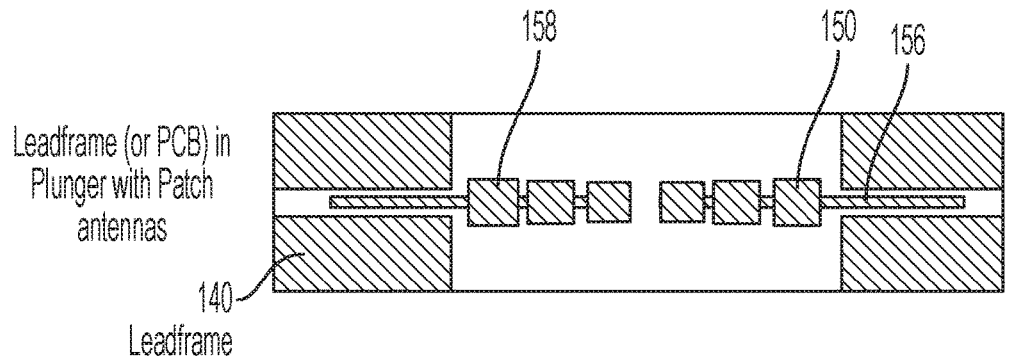
FIG. 14 illustrates a view of a test socket assembly with a patch antenna array in accordance with one or more embodiments.
Figure 15:
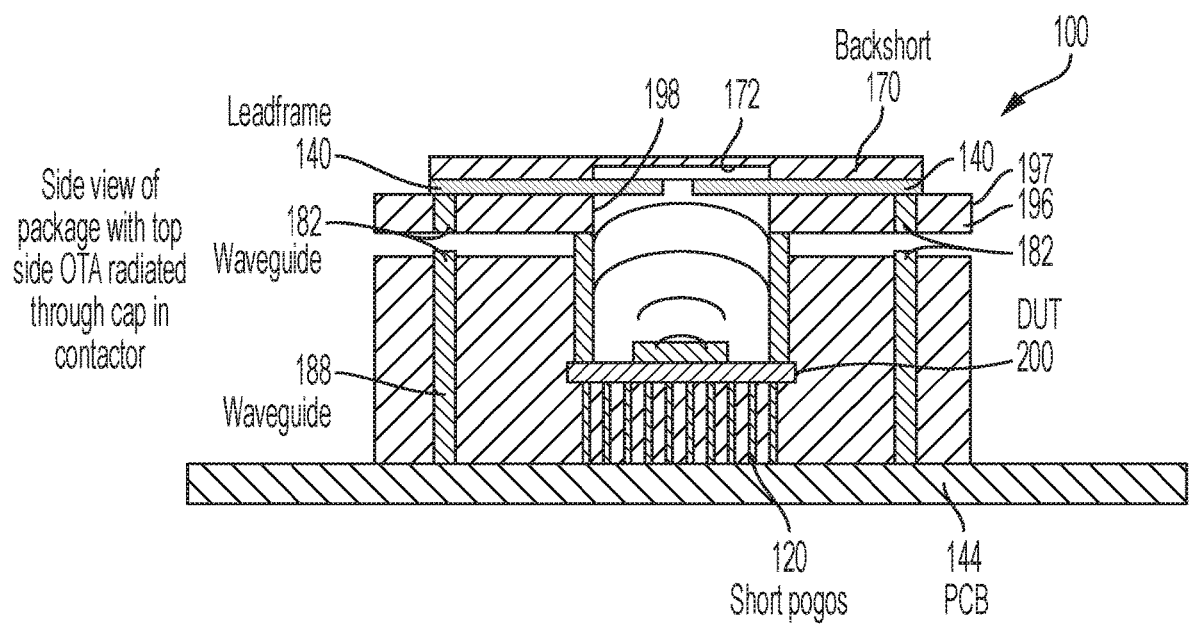
FIG. 15 illustrates a cross-sectional view of a test socket assembly as constructed in one or more embodiments.
Figure 16:
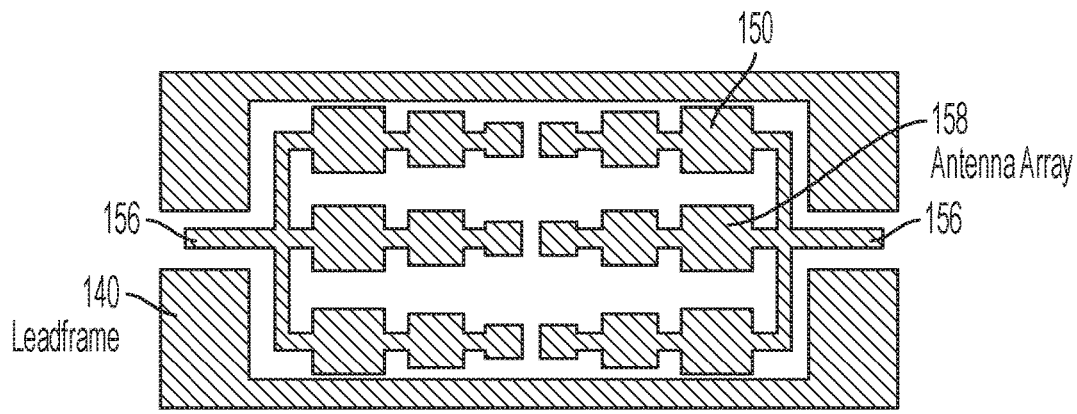
FIG. 16 illustrates a view of a test socket assembly with a patch antenna array in accordance with one or more embodiments.
Figure 17:
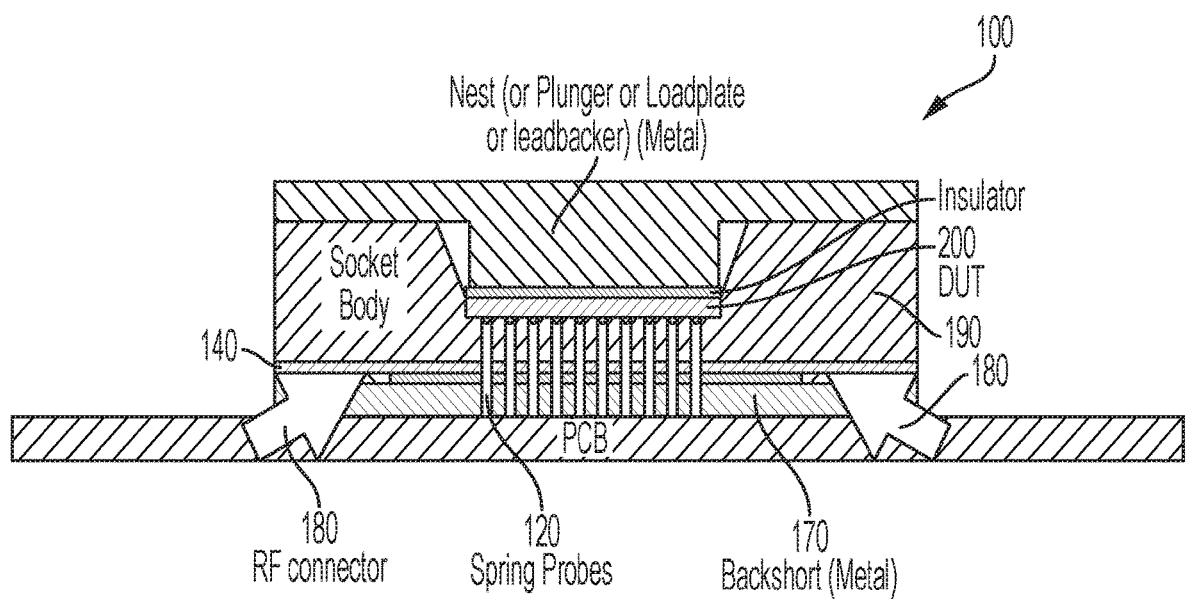
FIG. 17 illustrates a cross-sectional view of a test socket assembly as constructed in one or more embodiments.

The one or more antennas 150, in one embodiment, is formed from the lead frame assembly 140, and is part of the lead frame assembly 140. In one or more embodiments, at least one of the one or more antennas is a patch antenna. In one or more embodiments, the one or more antennas 150 is configured to transmit to the device under test 200, and/or receive signals from the device under test 200. In one or more embodiments, the one or more antennas 150 is a single patch antenna 152, and the single patch antenna 152 is a receiver and a transmitter. In one or more embodiments, the one or more antennas is a patch antenna array 158, and the patch antenna array(s) are receivers and/or transmitters, as shown in FIGS. 14-17. The patch antenna array 158 can be a linear array as shown in FIGS. 14 and 15. For example, the patch antenna array 158 includes a plurality of antennas 150 in a serial arrangement, in a single line. In one or more embodiments, the patch antenna array 158 can be a matrix, as shown in FIGS. 16 and 17. For example, the patch antenna array 158 includes a series of antennas 150 disposed both in series and in parallel to one another. For instance, multiple linear arrays are disposed parallel to each other. In one or more embodiments, the one or more antennas 150 is a horn antenna. The lead frame assembly 140, for example in FIG. 8, includes a coplanar wave guide, which communicates with patch antennas 152 at end of traces 156.

Figure 7:
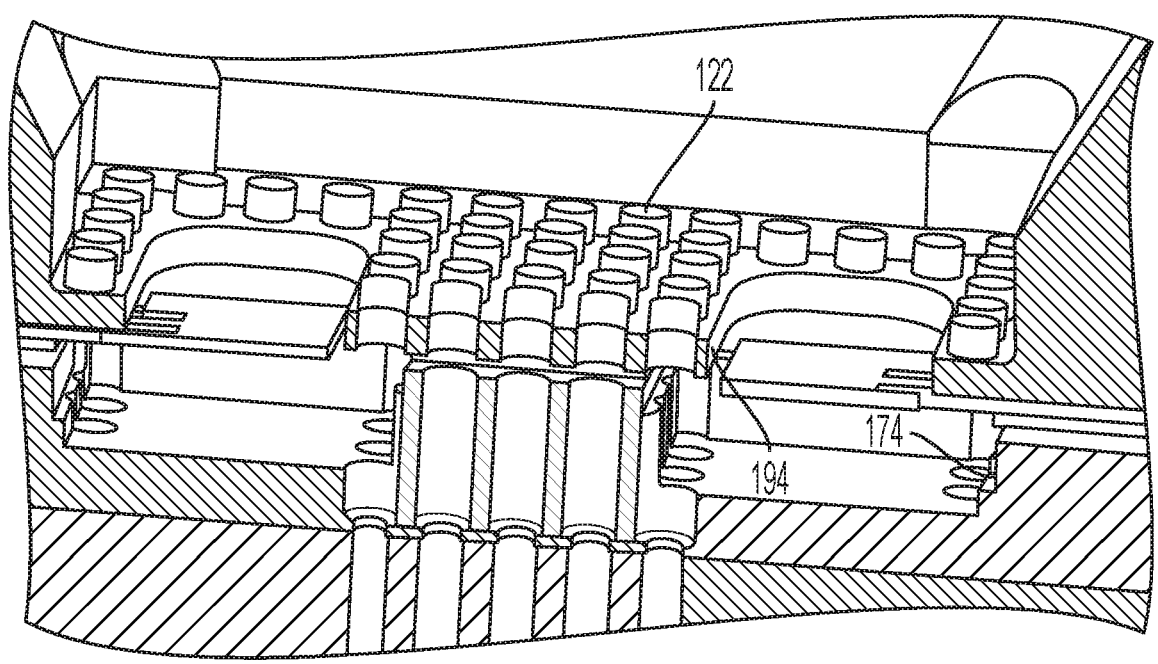
FIG. 7 illustrates a cross-sectional view of a test socket assembly as constructed in one or more embodiments.

In one or more embodiments, the contactor body 190 includes one or more radiation openings 194 adjacent to the one or more antennas, the one or more radiation openings 194 configured to allow and improve transmission of a wireless signal to or from the one or more antennas, as shown in FIG. 7. The contactor body 190 further includes holes 122 for the compliant interconnects 120.

In one or more embodiments, the test socket assembly 100 further includes a back short 170 disposed adjacent to the lead frame assembly 140 and the one or more antennas 150.

The back short 170, for example made of metal, is disposed between the printed circuit board 144 and the antennas 150, and acts as the ground reference for the coplanar waveguide and microstrip structure in the lead frame assembly 140. The back short 170 is disposed under the antenna 150 to match impedance through a coplanar waveguide to inset fed antenna. This can be optimized for phase and amplitude at any specified frequency. In one or more embodiments, the back short has at least one compliant interconnect therein.

The back short 170 is electrically coupled with a connector 180 or waveguide 182 (FIG. 5) via the coplanar waveguide. The back short 170 further includes a back short opening 174. Above the back short 170 is a substrate that holds the back short 170 and one or more antennas 150 in alignment. The substrate is a high speed, low loss dielectric material. The one or more antennas 150 and coplanar waveguide/microstrip trace are adhered to the substrate and act as the over the air transmitter and receiver path. The end of the coplanar wave guide terminates to connectors (or rectangular waveguides) that are mounted to the fixed alignment frame of the contactor body. The fixed alignment frame aligns the device under test to the antennas and compliant interconnects.

In one or more embodiments, the device under test 200 (FIG. 2) engages the compliant interconnects 120 (FIG. 5) and communicates wirelessly via the device under test antennas 210 with the antenna 150 of the test socket assembly 100. In one or more embodiments, the test socket assembly 100 uses vertical compliance to achieve reliability. The compliant interconnects 120 are compliant for the power, ground and low speed signal connections, such as balls. The microwave structures of the lead frame assembly 140 terminate in precision coaxial connectors or waveguides. In addition, the test socket assembly 100 includes at least one antenna 150, as further described below.

In one or more embodiments, the lead frame microwave structures are terminated externally to precision microwave coaxial connectors 180. In one or more embodiments, the lead frame assembly is impedance matched at the transition to the coaxial connectors 180 for optimal RF performance. The lead frame assembly can include a flat configuration with axially terminating connectors 180. In one or more embodiments, the lead frame has a gradual radius downward, so that coaxial connectors can be mounted below the socket contactor body, allowing for improved socket density in test handling conditions.

Several options for the signal lines are as follows. For instance, in one or more embodiments, the lead frame signal lines are configured in a coplanar waveguide transmission line structure. In one or more embodiments, the lead frame signal lines can be split with a balun structure, so that the split signals shift phase to a prescribed amount at a prescribed frequency. This allows for construction of a balanced differential signal pair. In one or more embodiments, the lead frame signal lines can incorporate loopback structures that are short and connect an input and output signal of a device under test for testing. In addition, in one or more embodiments, lead frame signal lines can be lengthened or shortened to add a prescribed signal delay.

Figure 12:
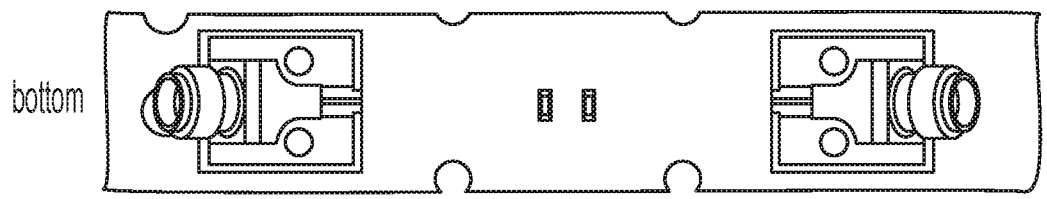
FIG. 12 illustrates a bottom view of a portion of a lead frame assembly as constructed in one or more embodiments.

The socket frame 180 is shown in FIG. 12 in greater detail. The coplanar waveguide transmission line structures terminate to a coaxial feed through connector or surface mounted connector, in one or more embodiments. A reduced diameter of the center conductor of the connector mates with an end of the lead frame assembly 140 lead. An electrical connection can be made, for example, by soldering the connection. In one or more embodiments, the ground plane can be mechanically attached, such as clamped with metal fasteners. This connection can be used to connect all of the ground planes to the socket body. In one or more embodiments, a transition from the lead frame signal line to the coaxial connector is matched so that impedance discontinuities are minimized for high speed performance.

In one or more embodiments, the lead frame microwave structures are terminated externally to precision microwave coaxial connectors. In one or more embodiments, the lead frame is impedance matched at the transition to the coaxial connectors 180 for optimal RF performance. The coaxial connectors 180 can be surface mounted to the lead frame. In one or more embodiments, the outside perimeter of the lead assembly includes the ground plane, however it is not necessary to interface every pin with the ground plane.

Figure 8:
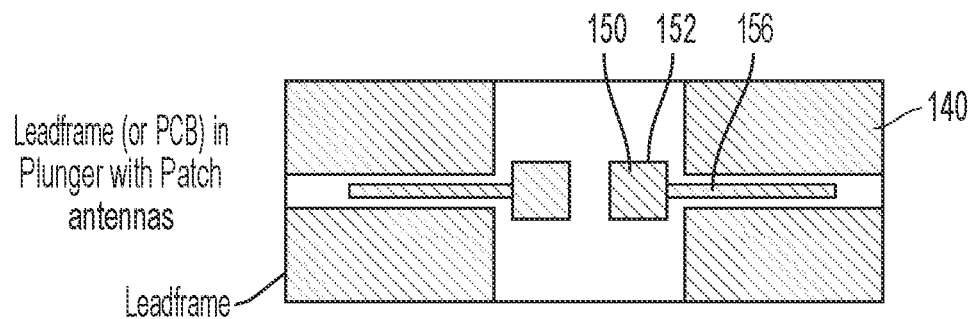
FIG. 8 illustrates a top view of a portion of a lead frame assembly as constructed in one or more embodiments.
Figure 9:
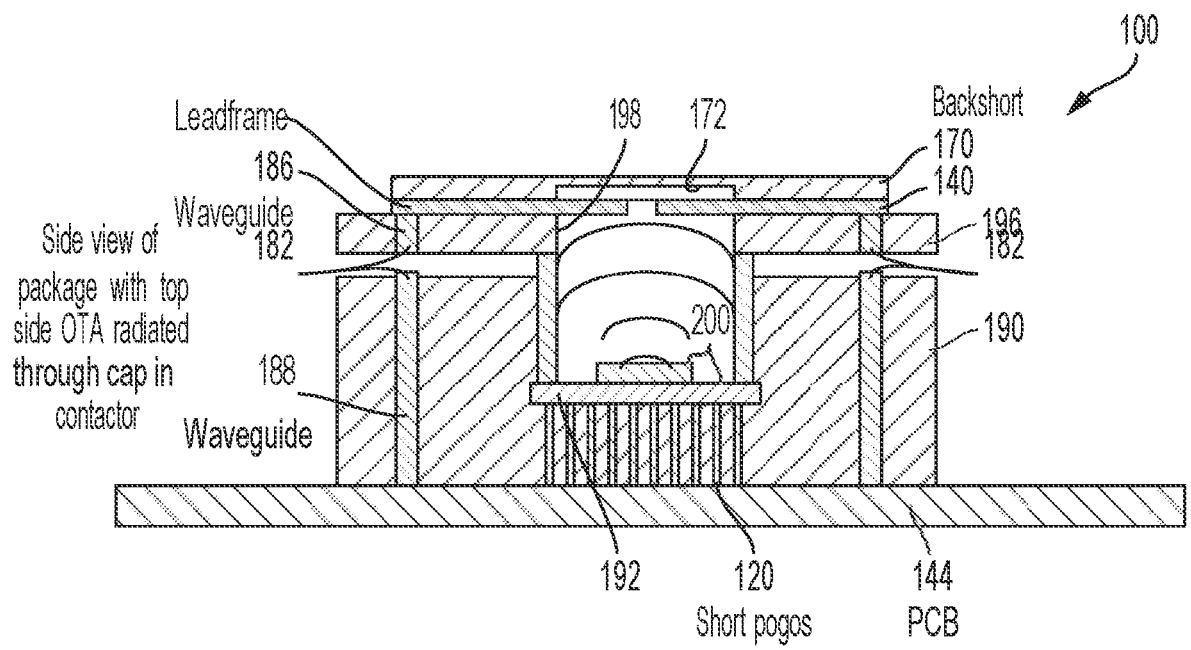
FIG. 9 illustrates a cross-sectional view of a test socket assembly as constructed in one or more embodiments.
Figure 10:
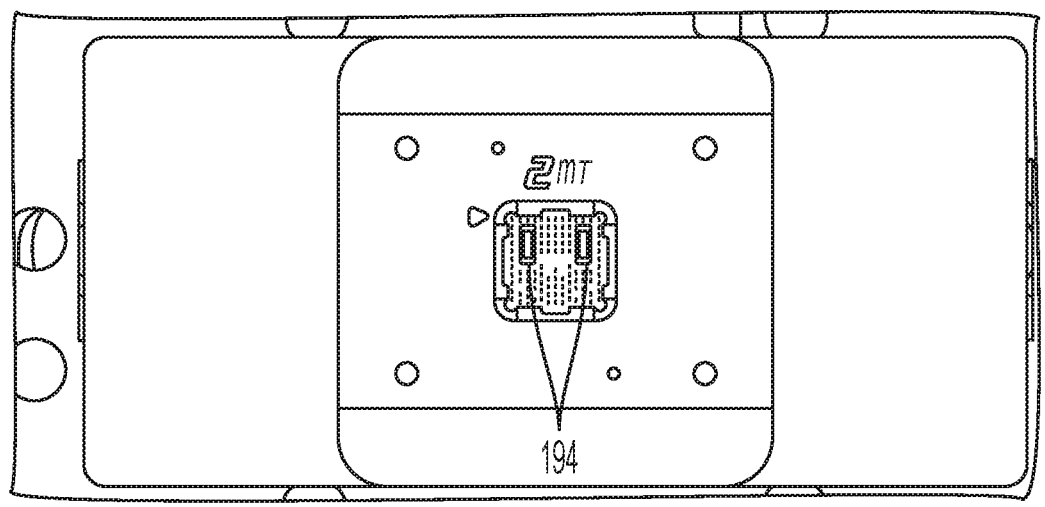
FIG. 10 illustrates a top view of a portion of a test socket assembly as constructed in one or more embodiments.
Figure 11:
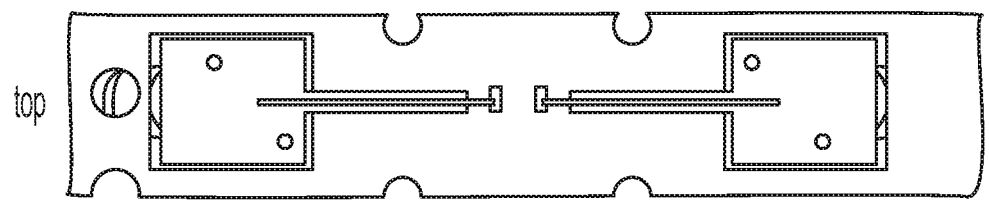
FIG. 11 illustrates a top view of a portion of a lead frame assembly as constructed in one or more embodiments.

Referring to FIGS. 8 and 9, another embodiment of a test socket assembly 100 is shown for a device under test 200 that emits wireless signals in an upward direction. In one or more embodiments, the test socket assembly 100 includes a contactor body 190 having one or more compliant interconnects 120 therein, a printed circuit board 144 coupled with the contactor body 190, where the contactor body 190 has a socket opening 192 sized and configured to receive a device under test 200 therein.

The test socket assembly 100 further includes a lead frame assembly 140 disposed on top of the contactor body 190 and electrically coupled with the printed circuit board 144, at least one back short 170 forms part of the plunger 197, and is disposed on top of the body 190, and one or more antennas 150 at least partially disposed within the lead frame assembly 140. The one or more antennas 150 is configured to directly and wirelessly communicate to the device under test 200 when the device under test 200 is disposed within the socket opening 192. The one or more antennas 150 is electrically coupled with the lead frame assembly 140, and the one or more antennas 150 is disposed between the contactor body and the back short.

Figure 19:
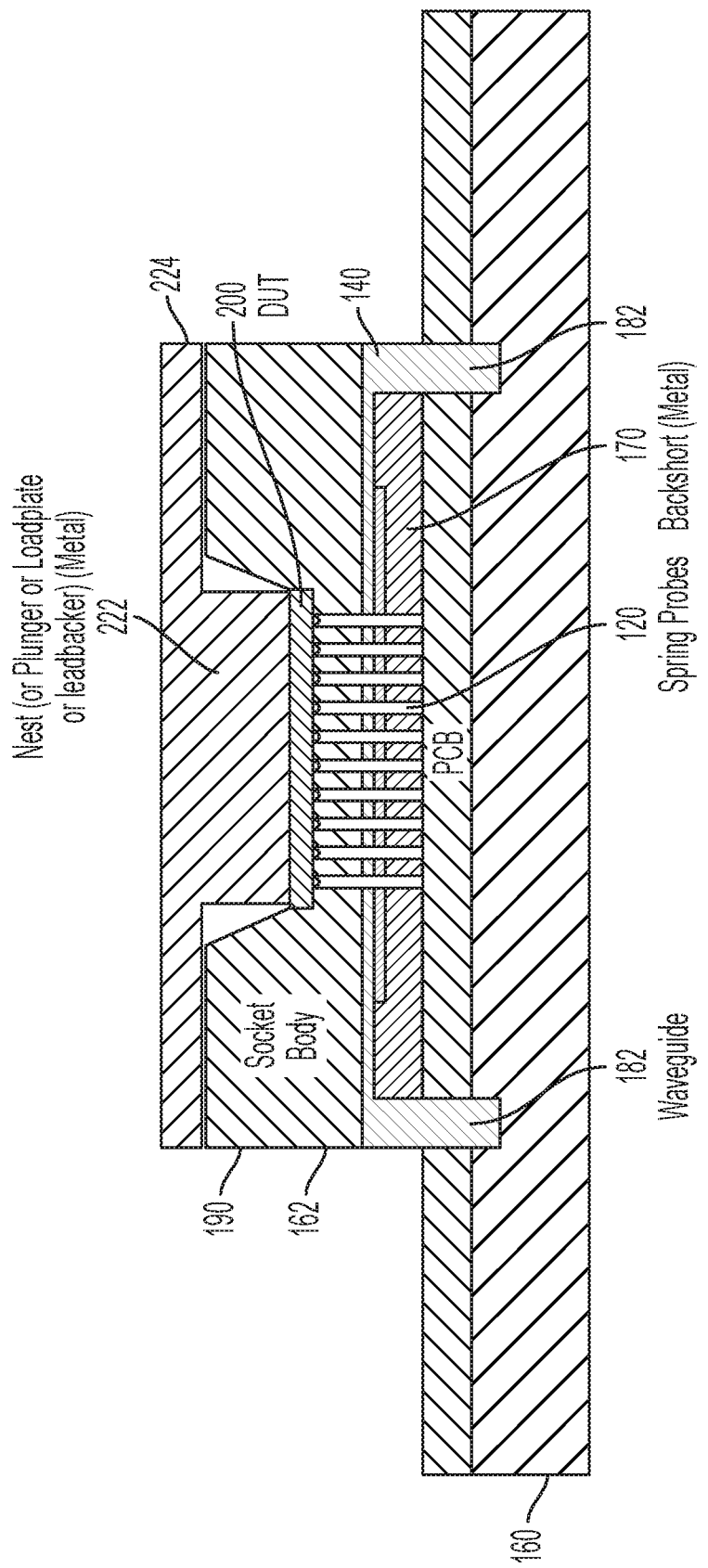
FIG. 19 illustrates a view of a test socket assembly including a contactor and tester in accordance with one or more embodiments.

In one or more embodiments, the back short 170 has at least one back short recess 172 therein, where the back short recess 172 is directly adjacent to the one or more antennas 150. In one or more embodiments, the test socket assembly 100 further includes a wave guide 182 disposed between the printed circuit board 144 and the lead frame assembly 140, where the wave guide 182 communicates high speed signals to the one or more antennas 150. In one or more embodiments, the test socket assembly 100 further includes a wave guide 188 disposed between tester and the lead frame assembly, as shown in FIG. 19.

In one or more embodiments, the compliant interconnects 120 are configured to transmit low speed signals. In one or more embodiments, the one or more antennas 150 include a horn antenna. In one or more embodiments, the test socket assembly 100 further includes a plunger 197 coupled with the lead frame assembly. A first wave guide 186 is disposed within the plunger 197 and is coupled with the lead frame assembly 140. A second wave guide 188 is disposed within the contactor body 190 and is coupled with the printed circuit board 144. The plunger 197 is movable from a first position (FIG. 9) to a second position. In the first position the first wave guide is uncoupled from the second wave guide, in the second position the first wave guide is electrically coupled with the second wave guide and the lead frame assembly 140 is electrically coupled with the printed circuit board 144. In one or more embodiments the wave guides can be electrically coupled in the first position.

In one or more embodiments, for top side radiation device under test, one or more antennas, such as patch antennas, are embedded in a plunger of a manual actuator or handler change kit. Wave guides 186, 188 are used to bring high speed signals from the tester directly to the antenna in the plunger 197. A small portion of the waveguide 186 is built into the plunger to eliminate any strain on the lead frame assembly from repeated insertions. The waveguide 182 in the contactor could couple directly to the lead frame assembly without the waveguide in the plunger, in one or more embodiments, for example as shown in FIG. 19. In one or more embodiments, the test socket assembly further includes a wave guide 182 disposed between tester and the lead frame assembly 140.

The back short 170 acts to reflect the energy of the antenna toward the device. For tester receiving, the device under test transmits out of its package and upward through a hole 198 in the plunger 197 toward the antenna 150. Compliant interconnects 120 are used to contact standard pads/BGA of a device under test package. The printed circuit board can include a wave guide for high speed transmission, or the printed circuit board can be bypassed by the wave guide in the contactor and terminate directly to the test assembly.

Figure 13:
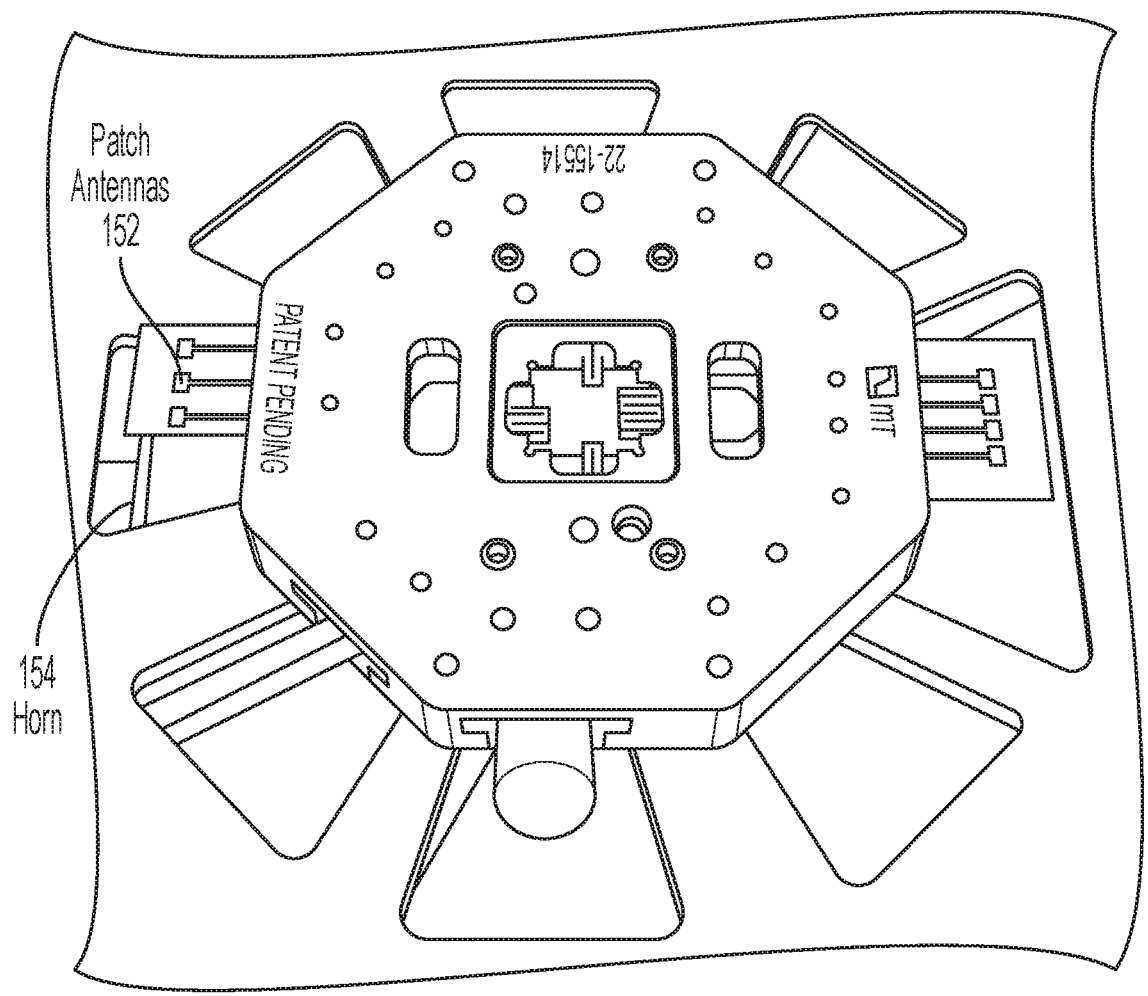
FIG. 13 illustrates a perspective view of a test socket assembly as constructed in one or more embodiments.

Referring to FIGS. 13 and 19, a test socket assembly 100 is shown for a device under test 200 that includes a standard pad/BGA pattern for high speed contact and an external antenna is used for communication. An antenna is included in the test socket assembly for communication between the contactor 162 and the tester 160. This allows standard contacted test at the device under test, and communicates wirelessly from the contactor to the test assembly with either patch antennas or horn antennas. A single test assembly can source multiple device under test receivers and a single test assembly to measure multiple device under test transmitters. The lead frame assembly incorporates the antenna, such as the patch antenna. The back short would extend over the patch antenna to direct the radiation down into the horn antenna.

The following is a method for using the test socket assembly. In one or more embodiments, a method for testing components includes disposing a device under test in a test socket assembly, the test socket assembly comprising a contactor body having one or more compliant interconnects therein, the contactor body having a socket opening sized and configured to receive a device under test therein, a lead frame assembly lead frame assembly disposed within the contactor body, and one or more antennas at least partially disposed within the contactor body, the one or more antennas configured to directly communicate to the device under test when the device is disposed within the socket opening, the one or more antennas electrically coupled with the lead frame assembly. The method further includes contacting the device under test with the compliant interconnects, and sending wireless signals to the device under test with the one or more antennas, and the device under test receives the wireless signals.

In one or more embodiments, the device under test includes one or more device antennas, and the method further includes sending wireless signals from the device under test to the one or more antennas. In one or more embodiments, the method further includes sending low speed signals between the device under test and the printed circuit board via the one or more compliant interconnects. In one or more embodiments, sending wireless signals to the device under test with the one or more antennas includes sending wireless signals to the device under test with at least one patch antenna within the contactor body.

Figure 18:
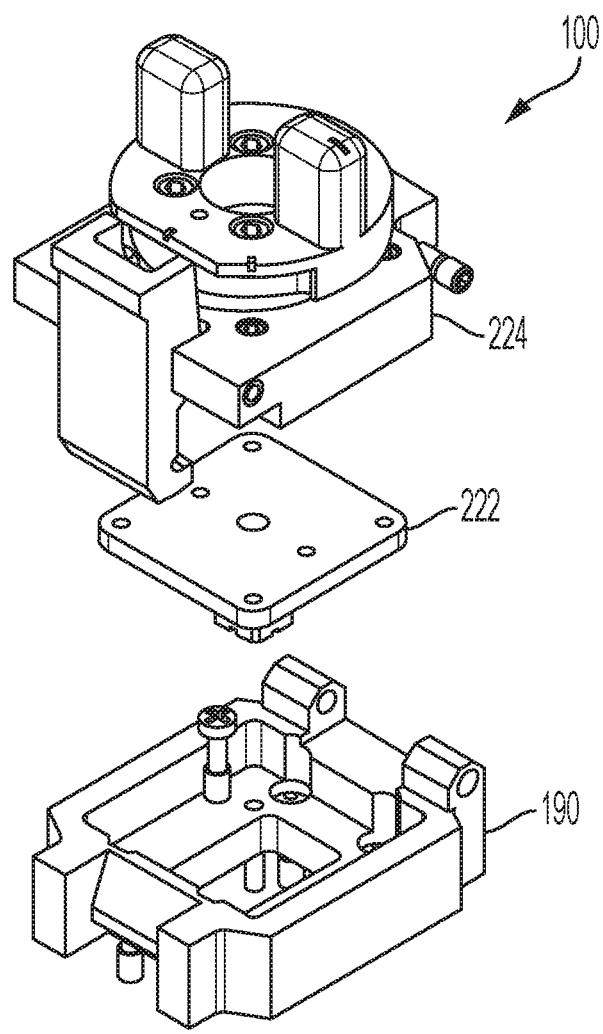
FIG. 18 illustrates a view of a manual actuator and handler with reflector in accordance with one or more embodiments.

Referring to FIGS. 18-19, in one or more embodiments, the test socket assembly 100 further includes a manual actuator, and the manual actuator has a reflector 222 therein. In one or more embodiments, the test socket assembly 100 further includes a handler nest 224, and the handler nest has a reflector 222 therein.

The test socket assembly described and shown herein is a test socket that is compatible with semiconductor back-end manufacturing, yet is capable in operating at the W-band frequencies. The compliant interconnects provide for reliable testing at low speed frequencies and are combined with antennas to wirelessly communicate with antennas within the device under test.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present application. The scope should, therefore, be determined with reference to the appended claims, along with the full scope of equivalents to which such claims are entitled.

The invention claimed is:

1. A test socket assembly comprising:
   a contactor body having one or more compliant interconnects therein;
   a printed circuit board coupled with the contactor body;
   the contactor body having a socket opening sized and configured to receive a device under test therein;
   a lead frame assembly disposed on top of the contactor body and electrically coupled with the printed circuit board;
   at least one back short disposed on top of the lead frame assembly; and
   one or more antennas at least partially disposed within the lead frame assembly, the one or more antennas configured to directly and wirelessly communicate to the device under test when the device under test is disposed within the socket opening, the one or more antennas electrically coupled with the lead frame assembly, the one or more antennas disposed between the contactor body and the back short, wherein the back short has at least one back short recess therein, the back short recess directly adjacent to the one or more antennas.

2. A test socket assembly comprising:
   a contactor body having one or more compliant interconnects therein;
   a printed circuit board coupled with the contactor body;
   the contactor body having a socket opening sized and configured to receive a device under test therein;
   a lead frame assembly disposed on top of the contactor body and electrically coupled with the printed circuit board;
   at least one back short disposed on top of the lead frame assembly;
   one or more antennas at least partially disposed within the lead frame assembly, the one or more antennas configured to directly and wirelessly communicate to the device under test when the device under test is disposed within the socket opening, the one or more antennas electrically coupled with the lead frame assembly, the one or more antennas disposed between the contactor body and the back short; and a plunger coupled with the lead frame assembly, a first wave guide disposed within the plunger and coupled with the lead frame assembly, a second wave guide disposed within the contactor body and coupled with the printed circuit board, the plunger movable from a first position to a second position, in the first position the first wave guide is uncoupled from the second wave guide, in the second position the first wave guide is electrically coupled with the second wave guide.

\* \* \* \* \*